(12) United States Patent
Hobelsberger

(10) Patent No.: US 7,705,623 B2
(45) Date of Patent: Apr. 27, 2010

(54) METHOD AND DEVICE FOR DETECTING INTERLAMINAR SHORT CIRCUITS

(75) Inventor: Max Hobelsberger, Wuerenlingen (CH)

(73) Assignee: ALSTOM Technology Ltd, Baden (CH)

( * ) Notice: Subject to any disclaimer, the term of this patent is extended or adjusted under 35 U.S.C. 154(b) by 0 days.

(21) Appl. No.: 12/352,923

(22) Filed: Jan. 13, 2009

(65) Prior Publication Data
US 2009/0179663 A1 Jul. 16, 2009

Related U.S. Application Data

(63) Continuation of application No. PCT/EP2007/055814, filed on Jun. 13, 2007.

(30) Foreign Application Priority Data

Jul. 13, 2006 (CH) .................................. 1125/06

(51) Int. Cl.
*G01R 31/34* (2006.01)
*G01R 31/06* (2006.01)
(52) U.S. Cl. ....................... 324/772; 324/545
(58) Field of Classification Search .............. 324/158.1, 324/500, 537, 545, 772; 318/490; 322/99; 340/500, 648; 702/115; 703/2
See application file for complete search history.

(56) References Cited

U.S. PATENT DOCUMENTS

| | | | | |
|---|---|---|---|---|
| 5,032,826 A | | 7/1991 | Miller et al. | |
| 5,162,669 A | * | 11/1992 | Hobelsberger | 327/512 |
| 5,341,095 A | * | 8/1994 | Shelton et al. | 324/772 |
| 5,990,688 A | * | 11/1999 | Bourgeois et al. | 324/545 |
| 6,469,504 B1 | * | 10/2002 | Kliman et al. | 324/228 |
| 6,714,020 B2 | * | 3/2004 | Hobelsberger et al. | 324/525 |
| 6,794,884 B2 | * | 9/2004 | Kliman et al. | 324/545 |
| 6,798,112 B1 | * | 9/2004 | Daley | 310/261.1 |
| 6,815,957 B2 | * | 11/2004 | Hobelsberger et al. | 324/545 |
| 6,873,152 B2 | * | 3/2005 | Kliman et al. | 324/241 |
| 6,927,598 B2 | * | 8/2005 | Lee et al. | 324/772 |
| 7,034,706 B1 | | 4/2006 | Nippes | |
| 7,102,379 B2 | * | 9/2006 | Hobelsberger et al. | 324/772 |
| 2004/0100300 A1 | * | 5/2004 | Lee et al. | 324/772 |

OTHER PUBLICATIONS

Internation Search Report for International No. PCT/EP2007/055814 mailed on Nov. 5, 2007.

* cited by examiner

*Primary Examiner*—Ha Tran T Nguyen
*Assistant Examiner*—Joshua Benitez
(74) *Attorney, Agent, or Firm*—Darby & Darby

(57) ABSTRACT

A method for determining a short circuit between at least two stator laminates in an electrical machine having a rotor mounted on a shaft and a stator, includes rotating the rotor on the shaft relative to the stator so to pass a magnetic stator flux, varying over time, through the stator, determining, during the rotation, a measurement variable sensitive to a short-circuit current caused by the magnetic stator flux between the at least two stator laminates, and determining the magnetic stator flux. In addition, a theoretical model is provided describing a relationship between the magnetic stator flux and the measurement value or an auxiliary variable derived from the measurement value, and the measurement variable or the auxiliary variable is compared with the theoretical model. A device for carrying out a method for determining a short circuit is also provided.

20 Claims, 2 Drawing Sheets

METHOD AND DEVICE FOR DETECTING INTERLAMINAR SHORT CIRCUITS

CROSS REFERENCE TO PRIOR APPLICATIONS

This application is a continuation International Patent Application No. PCT/EP2007/055814, filed on Jun. 13, 2007 and published in the German language on Jan. 17, 2008 as WO 2008/006655, which claims priority to Swiss Patent Application No. CH 01125/06, filed on Jul. 13, 2006. The entire disclosure of both applications is incorporated by reference herein.

The present invention relates to a method and a device for detecting short circuits between stator laminates in an electrical machine, in particular an electrical generator.

BACKGROUND

Large generators and motors are routinely checked when stationary for interlaminar short circuits between the laminates, which are normally isolated from one another, in the laminated core of the stator. However, it is desirable to detect faults such as these during operation of the machine since this allows interlaminar short circuits to be identified earlier and allows measures to prevent further damage to be taken earlier.

US patent specification U.S. Pat. No. 5,032,826 (Miller et al.) discloses the shaft voltage of the machine being measured and being used to draw conclusions about interlaminar short circuits. The shaft voltage is that voltage which occurs along the shaft, in particular between the two ends, or between the shaft and ground during operation of the electrical machine. According to U.S. Pat. No. 5,032,826, changes in the shaft voltage are assessed in the frequency domain or in the time domain, as an indication of interlaminar damage.

SUMMARY OF THE INVENTION

The known method has the disadvantage that it does not indicate what changes in the shaft voltage should be assessed as an indication of damage. The interpretation of the measurement results is generally therefore not clear. The reasons for this, among others, are as follows:
- the waveform of the shaft voltage depends on the load state of the machine: depending on the load state, a different spectrum occurs, or the waveform of the shaft voltage changes.
- The changes in the shaft voltage caused by the normal interlaminar short circuits are small in relation to the normal shaft voltage which occurs without an interlaminar short circuit. These changes are therefore difficult to detect, and the detection is not reliable.
- The measurement results are often corrupted by poor contacts between contact brushes and the shaft, since the spectrum of the measured shaft voltage is highly dependent on the contact quality.

An object of the present invention is to provide a method for detecting interlaminar short circuits, by means of which short circuits such as these can be identified with greater reliability. A further or alternate object of the present invention is to provide a device for this purpose.

The present invention provides a method for determining short circuits between stator laminates in an electrical machine which has a rotor, which rotates on a shaft, and a stator through which a magnetic stator flux which varies over time passes. In particular, the electrical machine may be a motor or a generator, for example a large generator, as used in power stations. According to the method, a measurement variable which is sensitive to a short-circuit current between at least two stator laminates is determined during operation of the electrical machine. A short-circuit current (eddy current) such as this is created by the magnetic stator flux which varies over time and passes through the location of the short circuit. The magnetic stator flux (or at least a variable which is characteristic of this stator flux) is determined by measurement and/or calculation, and in that the measurement variable or an auxiliary variable derived therefrom is compared with a theoretical model, which produces a relationship between this magnetic stator flux and the measurement variable or the auxiliary variable. A measure for a short circuit is determined from the comparison.

One aspect of the present invention is to understand the behavior of the measurement variable when a short circuit is present, and to use this to derive a theoretical model of the measurement variable, which describes the measurement variable as a function of the stator flux. The theoretical model generally results in one or more equations. The measured values of the measurement variable are now compared with this expected behavior, for example by mathematically fitting the equations to the measurement results, and using the comparison to draw conclusions about the presence or the absence of a short circuit. This allows a short circuit to be detected and quantified reliably.

For the purposes of the present invention, a theoretical model is a system of one or more relationships (for example equations, inequalities, numerical relationships, etc.) which produce a relationship between the stator flux or specific components of the stator flux and the measurement variable or an auxiliary variable, which can be derived from the measurement variable, or specific components thereof.

By way of example, the measurement variable may be the shaft voltage. However, it may also be some other variable which varies in a characteristic manner when a short-circuit is present, for example a ring flux around the shaft or a voltage induced by such a ring flux in a suitable measurement loop.

Various variables can be determined from the comparison as a measure of the short circuit. In the simplest case, this is a measure of the probability of the presence of a short circuit. However, a measure for the magnitude of the short circuit and/or the spatial position of the short circuit in the stator can also be determined as a function of the theoretical model that is used.

The comparison is preferably carried out using the theoretical model in the frequency domain. For this purpose, spectral components of the measurement variable or of the auxiliary variable derived therefrom are determined at (preferably integer) multiples of the rotation frequency, and these spectral components are compared with a theoretical model which produces a relationship between the stator flux, or its spectral components, and the spectral components of the measurement variable and/or auxiliary variable.

In one preferred embodiment a transfer function between a spectral component of the magnetic stator flux and a spectral component of the measurement variable or of the auxiliary variable derived therefrom is determined for the same multiple of the rotation frequency for a plurality of integer multiples (harmonics) of the rotation frequency. These transfer functions are then compared with a theoretical model of the transfer functions. By way of example, the theoretical model may allow statements about the relationship between the amplitudes and phases of the transfer functions and the order of the harmonics (that is to say the multiple of the rotation frequency at which the transfer function was determined), which are then checked in the comparison.

In particular, the measurement variable may be a shaft voltage. In this case, a change in the shaft voltage with respect to a reference value is preferably determined as the auxiliary variable. A transfer function between a spectral component of the magnetic stator flux and a spectral component of the auxiliary variable is then preferably calculated for the same multiple of the rotation frequency, for a plurality of multiples of the rotation frequency. A determination is then made as to the extent to which at least one of the following characteristics is satisfied:

the amplitude of the transfer function depends on the square of the multiple of the rotation frequency, at which the spectral component was determined;

the phase of the transfer function depends linearly on the multiple of the rotation frequency.

These expected characteristics can be derived from a theoretical model, as will also be described in the following text.

Alternatively, the measurement variable may, for example, be a ring flux along a closed path around the shaft which, for example, was determined directly by measurement using suitable probes or indirectly from induction voltages in suitable conductor loops. A change in the ring flux with respect to a reference value is then preferably used as the auxiliary variable. Once again, a transfer function between a spectral component of the magnetic stator flux and a spectral component of the auxiliary variable is calculated for the same multiple of the rotation frequency for a plurality of multiples of the rotation frequency. A determination is now made as to the extent to which at least one of the following characteristics is satisfied:

the amplitude of the transfer function is linearly dependent on the multiple of the rotation frequency;

the phase of the transfer function depends linearly on the multiple of the rotation frequency.

These characteristics can also be derived from a theoretical model, which is also described in the following text.

A change in the measurement variable with respect to a reference value has been used as an auxiliary variable in each of these examples. This is also entirely generally advantageous even when other measurement variables than the shaft voltage or the ring flux are determined. The measurement variable in this case generally depends not only on whether an interlaminar short circuit has occurred, but it is also dependent to a greater or lesser extent on the load state of the electrical machine. Reference values of the measurement variable are therefore advantageously determined at a reference time for selected reference load states of the electrical machine and are stored in a memory. At least one reference value of the measurement variable in a reference load state, which is similar to an instantaneous load state, is then used to determine the auxiliary variable.

The magnetic stator flux is preferably determined while the method is being carried out, for example by a suitable measurement. However, it is also possible for reference values of the magnetic stator flux to be determined at a reference time for selected reference load states of the electrical machine and to be stored in a memory. At least one reference value of the magnetic stator flux in a reference load state, which is similar to the instantaneous load state, is then used for the comparison with the theoretical model, in order to minimize the influence of the load state on the result of the comparison.

The magnetic stator flux can in both cases be determined by at least one magnetic measurement probe, which is advantageously arranged in an air gap, which is arranged between the stator and the rotor, of the electrical machine or in the stator of the electrical machine. Instead of or in addition to this, the magnetic stator flux may, however, also be determined by calculation from a terminal voltage of the electrical machine and/or from machine parameters and load parameters of the electrical machine.

A device according to the invention for determining interlaminar short circuits accordingly preferably has:

a measurement arrangement for determining a measurement variable which is sensitive to a short-circuit current, caused by the magnetic stator flux, between at least two stator laminates;

a unit for determining the magnetic stator flux from measured data and/or by calculation; and an evaluation unit, which is designed to compare the measurement variable or the auxiliary variable with a theoretical model for the relationship between the measurement variable or the auxiliary variable and the magnetic stator flux and to determine at least one value from the comparison which represents a measure for the presence of a short circuit.

The unit for determining the stator flux, as well as the evaluation unit, may be implemented in hardware, in software or in a combination of hardware and software.

In one preferred refinement, the evaluation unit comprises a transformation module which is implemented in hardware and/or software and is designed to determine spectral components of the measurement variable or of an auxiliary variable derived therefrom, for example by filtering in the time domain and Fourier transformation. The evaluation unit is then designed to compare selected spectral components of the measurement variable or of an auxiliary variable derived therefrom with the theoretical model.

If the measurement variable is the shaft voltage, the measurement arrangement preferably comprises at least two brushes (contacts), in order to determine the shaft voltage between two different axial points on the shaft.

If the measurement variable is a ring flux along a closed path around the shaft, the measurement arrangement preferably comprises at least one magnetic measurement probe, for example two or more measurement loops which are arranged on different radial planes, for determining the ring flux.

The unit for determining the magnetic stator flux preferably comprises at least one magnetic measurement probe for measuring the stator flux. Instead of this, however, the unit may also comprise a module which is implemented in hardware and/or software, in order to calculate the stator flux, for example from design and performance data, or from the terminal voltage.

BRIEF DESCRIPTION OF THE DRAWINGS

Preferred embodiments of the invention will be described in the following text with reference to the drawings, in which.

DETAILED DESCRIPTION OF THE PREFERRED EMBODIMENTS

First of all, the physical principles on which the method according to the invention is based will be explained in the following text, with the aim of using this to derive a theoretical model for various measurement variables. First of all, reference is made to FIGS. 1 to 3 for this purpose.

In general, this method is used to detect interlaminar short circuits by examining change patterns of the shaft voltage or, more generally, of the ring fluxes in the stator. A search is preferably carried out for characteristic change patterns in the spectrum of the shaft voltage or of the ring fluxes, more clearly identifying an interlaminar short circuit.

The method according to the invention is based on a number of principles. A first important principle is the knowledge that the electrical circuit of the interlaminar short circuit has a highly resistive effect up to a certain cut-off frequency (in general up to about 1000 Hz). The impedance of the circuit changes to the inductive domain only at high frequencies. This characteristic applies in particular to circuits for interlaminar short circuits which are located on the surface of the laminated core. In accordance with the induction law, the voltage which is induced in the interlaminar short circuit is directly proportional to the first derivative with regard to time of the magnetic stator flux Φ which passes through this circuit. Because of the resistive characteristics of the interlaminar short circuit, this proportionality also applies to the eddy current or to the short-circuit current $i_K$ at low frequencies:

$$i_K \propto \frac{d\Phi}{dt}, \quad (1)$$

where the proportionality constant depends on the characteristics of the interlaminar short circuit.

This fact likewise applies to the individual harmonics of the current, that is to say for each spectral component of the short-circuit current at a multiple n of the rotation frequency $f_r$. A transfer function or current transfer function can be formed for each individual harmonic, describing the relationship between the relevant harmonics of the short-circuit current in the interlaminar short circuit as an output variable, and the corresponding harmonics of the stator flux as an input variable. The absolute value of this transfer function in each case rises approximately linearly (at a constant rotation frequency) with the order n of the harmonic:

$$\left|\frac{i_{k,n}}{\Phi_n}\right| \propto n. \quad (2)$$

The phase shifts of the harmonics of the electric current with respect to the harmonics of the magnetic stator flux are in this case in each case approximately −90° (with counter-clockwise association of the induction vector and current direction), and are independent of the rotation frequency and order:

$$\arg\left(\frac{i_{k,n}}{\Phi_n}\right) = -\frac{\pi}{2}. \quad (3)$$

The current harmonics therefore lag the flux harmonic by 90°.

Figure 1:
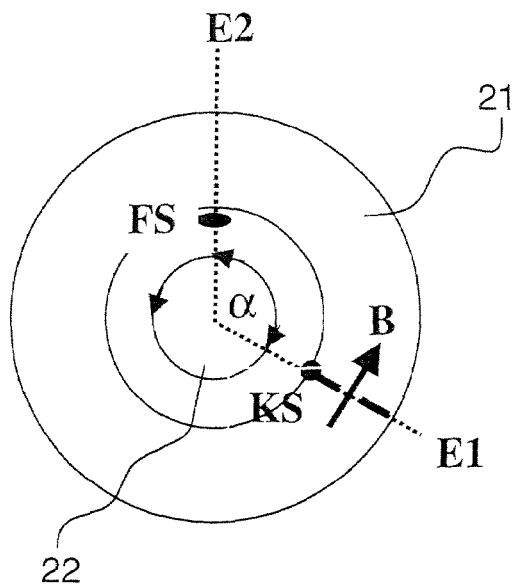
FIG. 1 shows a schematic illustration of various variables on a plane at right angles to the shaft axis.
Figure 2:
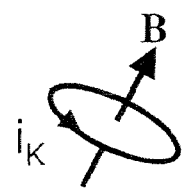
FIG. 2 shows an outline sketch illustrating how the short-circuit current is created.

FIGS. 1 and 2 illustrate the relationships between the variable magnetic field B and the short-circuit current $i_K$. In this context, FIG. 1 shows, schematically, an outer stator 21 and a rotor 22 which rotates therein in the direction of the arrow (in the counterclockwise sense). There is a short circuit KS on the inside of the stator 21. The short circuit may be considered to be closed conductor loop in which a short-circuit current $i_K$ flows on a radial plane E1. As is illustrated in FIG. 2, the short-circuit current flows orthogonally with respect to the stator flux (which varies over time), which is represented here by the magnetic field B.

A further fundamental is the knowledge that a part of the additional magnetic flux produced by the short-circuit current flows as a ring flux through the stator, and surrounds the rotor and the shaft of the machine. The additional ring flux is directionally proportional to the short-circuit current:

$$\Phi_S \propto i_K \quad (4)$$

Figure 3:
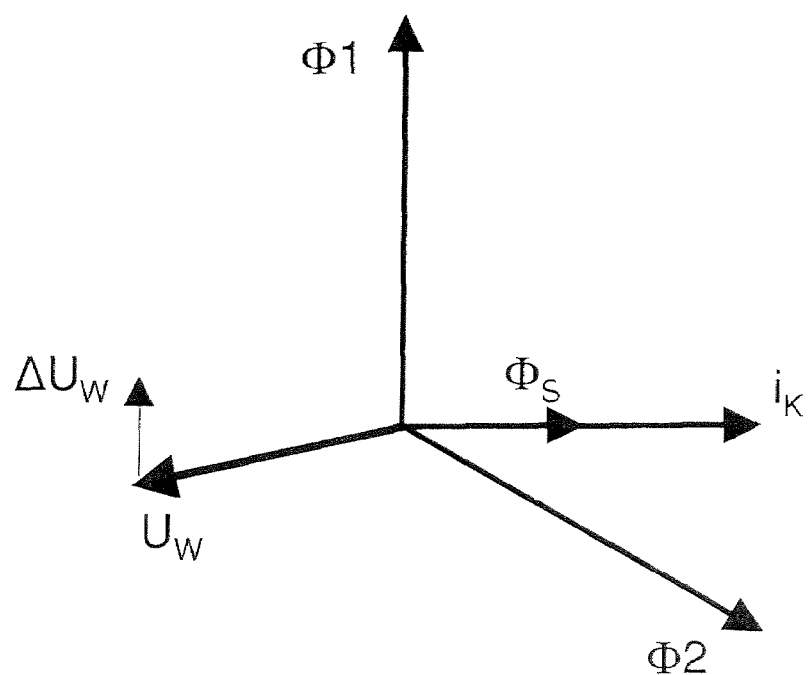
FIG. 3 shows a schematic vector illustration of various variables.

The ring flux is illustrated in the vector illustration in FIG. 3. Ring flux $\Phi_S$ and the short-circuit current $i_K$ are in phase and have a fixed phase relationship to the stator main fluxes Φ1, Φ2. The ring flux $\Phi_S$, which varies over time, in turn induces a voltage in the axial direction in the shaft of the rotor, that is to say it leads to an additional component $\Delta U_W$ of the shaft voltage $U_W$, whose phase is orthogonal to the ring flux $\Phi_S$.

The additional ring flux can therefore, for example, be determined directly by ring flux measurement sensors or preferably indirectly by measurement of the shaft voltage. Ring flux measurement sensors are, for example, two or more dimensionally identical conductor loops which are arranged in the stator at the same axial position but at points which are offset through a specific angle, for example through 180°, in the circumferential direction.

The shaft voltage can be determined in a known manner by voltage measurement across sliding contacts (brushes). The ring flux associated with the short-circuit current induces an additional, characteristic component of the shaft voltage, which would not be present without an interlaminar short-circuit current, in the loop between the shaft, housing/ground and measuring instrument. The following text discusses only the shaft voltage, but the statements apply just as well in the same sense to any other voltage which is proportional to the derivative over time of the ring flux, for example for the voltage which can be determined by ring flux measurement sensors.

The additional component of the shaft voltage caused by the interlaminar short circuit has the following characteristics, which form the theoretical model for the additional component:

All the harmonics are present which the stator flux also has. This is a major difference from the normal shaft voltage, which has only a small number of harmonics in the stator flux in the dominant variable, depending on the design of the machine.

The additional component of the shaft voltage is proportional to the first derivative with respect to time of the additional ring flux $\Phi_S$, that is to say it is proportional to the second derivative with respect to time of the stator flux:

$$U_w \propto \frac{d\Phi_s}{dt} \propto \frac{di_k}{dt} \propto \frac{d^2\Phi}{dt^2}. \quad (5)$$

The ratio between the amplitudes of the harmonics of this component and the amplitudes of the corresponding harmonics of the stator flux rises in the resistive area of the short-circuit loop owing to the second derivative, with respect to time, in this equation being a square term with the order of the harmonic:

$$\left|\frac{U_{w,n}}{\Phi_n}\right| \propto n^2 \quad (6)$$

The phase shifts between mutually corresponding harmonics of the additional component and of the stator flux are governed by the impedance of the short-circuit loop and its current transfer function. In the lower, resistive frequency range, this phase shift will disappear approximately if the magnetic flux which flows through the plane of the interlaminar short circuit is considered as the phase reference. In this resistive range, the phase spectrum of the additional component of the shaft voltage differs only slightly from the phase spectrum of the stator flux. If other planes through which the flux passes are considered as the reference plane for phase angle calculation, the phase shift between the plane of the interlaminar short circuit and the reference plane must be taken into account by suitable addition of phase angles, in which case the rotation direction must be taken into account. Positive additional angles result when the interlaminar short-circuit plane is located before the reference plane in the rotation direction. This is illustrated in FIG. 1, in which a measurement probe (field probe) FS is fitted in order to measure the stator flux on a reference plane E2. The individual additional phase angles φ(n) of the harmonics result from the orders n of the harmonics, the number of pole pairs p and the angle α between the two planes, as follows:

$$\phi(n) = n \cdot p \cdot \alpha \quad (7)$$

A (discrete) transfer function T(jn) can thus be found which describes the relationship between the n-th order harmonics of the change component of the shaft voltage and the harmonics of the stator flux, and it satisfies the following conditions, at least in the lower frequency range:

$$T(jn) = A(n) \cdot e^{j\phi(n)} \text{ where } A(n) = C \cdot n^2,$$

$$\phi(n) = n \cdot p \cdot \alpha \quad (8)$$

and thus $$T(jn) = C \cdot n^2 \cdot e^{j(np\alpha)} \quad (9)$$

The "magnitude" of the interlaminar short circuit is included in the constant C (it is relatively independent of the order n at relatively low frequencies) and is proportional to the product of the length of the fault location (to be precise proportional to the area of the loop) and the current level. Since a voltage which is proportional to the length of the fault location is induced in the short-circuit loop, C can also be interpreted as a measure of the short-circuit power. The location of the short-circuit can be determined from the phase-shift angles n·p·α.

A further basis of the present invention is the discovery that, furthermore, a (discrete) transfer function W(jn) can be formed for the entire shaft voltage, including those components which are not caused by the additional ring flux, describing the relationship between the shaft voltage and the stator flux in the frequency domain, and that this transfer function is relatively independent of the respective instantaneous load in relatively wide vicinity of a load point of the machine.

These characteristics of the overall shaft voltage and the additional component now allow the following procedure in order to detect an interlaminar short circuit from a comparison with historic data:

A. A comparison of the spectrum of the instantaneous shaft voltage with the spectrum of a reference shaft voltage is carried out, recorded in approximately the same load conditions and without any interlaminar fault being present. When an interlaminar short circuit is present, the phase angles of the harmonics of the shaft voltage change, and additional harmonics occur. The spectrum of a change component of the shaft voltage can be determined by vectorial subtraction of mutually corresponding harmonics (that is to say the harmonics with the same order numbers). If this spectrum satisfies the abovementioned phase and amplitude conditions of the theoretical model, this indicates an interlaminar short circuit. The spectrum is therefore preferably investigated for one or more of the following conditions:

The phase spectrum of the change component of the shaft voltage is obtained from the spectrum of the flux by addition of phase angles φ(n)=n·p·α. The phase shifts between mutually corresponding harmonics of the flux and of the change component therefore have the constant term α in the lower frequency range, that is to say in the resistive range of the short-circuit loop. In the higher frequency range, the phase shift changes corresponding to the current transfer function of the short-circuit loop.

The amplitude spectrum of the change component results, at relatively low frequencies, approximately from the amplitude spectrum of the flux by multiplication by a factor which rises with the square of the frequency, $$k = C \cdot n^2,$$

where C is a constant over all orders n.

Lines which do not exist or are present only weakly in the spectrum of the shaft voltage appear increasingly in the spectrum of the change component.

A (discrete) transfer function can be found, which describes the relationship between the harmonics of the change component and the harmonics of the stator flux, and which satisfies the following conditions, at least in the lower frequency range:

$$T(jn) = A(n) \cdot e^{j\phi(n)} \text{ where } A(n) = C \cdot n^2,$$

$$\phi(n) = n \cdot p \cdot \alpha.$$

The presence of one or more of these conditions can be deduced, for example, from the results of a non-linear fit which is carried out for the individual harmonics of the spectrum of the change component on the basis of the stated equations, and from which at least one of the following variables is determined: the value of the constant C, the value of the angle α and one or more statistical parameters which describe the quality of the fit, and thus allow conclusions about the probability of an interlaminar short circuit.

B. The instantaneous harmonics of the magnetic stator flux are advantageously determined in this case by measurement, and are related to the corresponding harmonics of this change component of the shaft voltage.

C. A simultaneous measurement of the harmonics of the stator flux and the harmonics of the shaft voltage allows a transfer function W(jn) of the shaft voltage to be determined which describes the relationship between the shaft voltage and the stator flux in the frequency domain. This transfer function is also valid, to a good approximation, in the vicinity of a load point, since the characteristics of the magnetic path change only slightly in the vicinity of a load point. Only a small number of reference points therefore need be approached for reference formation in the case of a machine which is known not to have any interlaminar short circuit, and the transfer functions of the shaft voltage are determined and stored as reference transfer functions $W_{Ref}(jn)$ at these load points. An interlaminar short circuit will change these transfer functions in the manner described above:

$$W(jn) = W_{Ref}(jn) + T(jn) \qquad (10)$$

Changes in the transfer function which satisfy the stated criteria can therefore be assessed as an indication of an interlaminar short circuit.

D. So-called stray-flux coils are advantageously used to determine the harmonics of the stator flux, which are in any case installed in the air gap of many generators in order to detect shorts between turns in the rotor. By way of example, the main flux flows directly through the measurement coil for the radial field (field components in the direction at right angles to the rotor surface). Values can be measured by voltage measurements which are proportional to the first derivatives with respect to time of the harmonics of the stator flux. Integration of this with respect to time results in values which are proportional to the harmonics of the stator flux. Depending on the position of these measurement coils, an additional phase shift is obtained between the vectors of the harmonics of the stator flux and the corresponding vectors of the change component. This also allows the interlaminar short circuit to be located on the basis of the additional phase angle.

E. Furthermore, a conductor loop which passes through the cooling slots and through which a part of the stator flux flows can be arranged in the stator, in order to determine the harmonics of the stator flux directly. The first derivatives with respect to time of the harmonics of the stator flux can be determined by voltage measurement. Depending on the position of this auxiliary loop and therefore of the reference plane, this once again results in an additional phase shift between the vectors of the harmonics of the stator flux and the corresponding vectors of the change component. This once again allows the interlaminar short circuit to be located on the basis of the additional phase angle.

F. When using ring flux sensors, the individual coils may, of course, also be used to determine the harmonics of the flux. In this case, the use of a plurality of reference planes also allows more reliable determination of the damage level.

G. If suitable voltage dividers (that is to say with a suitable, at least known, frequency response) are available, statements can also be obtained about the spectrum of the stator flux, directly from the terminal voltages of the generator.

H. The spectra of the shaft voltage together with the simultaneously measured spectra of the stray-flux coils and/or the spectra of the stator flux are preferably recorded at a multiplicity of load points, for example during starting of the machine (preferably in the region of the normal operating point), together with the data relating to the load point (wheel power, reactive power) as items of historical reference information. This allows a change component to be determined even more accurately since a multiplicity of reference-transfer functions or reference spectra are available.

J. If only restricted numbers of reference values and historical information items relating to the shaft voltage in different load states are available, it is not possible to use all the harmonics of the shaft voltage for analysis, but only those which have newly occurred. The spectral content of the shaft voltage is in fact independent of the load state in the sense that spectral lines suppressed because of the machine geometry do not occur in different load states, either. Newly occurring harmonics can therefore preferably be assessed as parts of the abovementioned change component.

K. If the harmonics of the stator flux are not available from a direct measurement, the harmonics can also be calculated approximately from the machine design data.

L. The arrangement of the abovementioned electrical auxiliary loop, which surrounds parts of the laminated stator core, also makes it possible to deliberately introduce a reference interlaminar short circuit with a known geometry (current level, impedance) into the machine. By active variation over time of the characteristics of the circuit, for example the current level (opening and closing of the interlaminar short circuit) and corresponding measurement of the parameters (current level when the circuit is closed, voltage when the circuit is open), it is possible to determine the effect on the shaft voltage of an interlaminar short circuit of known size. This makes it possible to assess the level and thus the potential hazard of an actually existing interlaminar short circuit by comparison with a reference value. Test currents of known frequency, amplitude and phase angle can also be applied by active operating means such as electronic current sources, and their effects on the shaft voltage can be stored as reference values. The transfer function of a change component of a known interlaminar short circuit can thus be determined.

The same statements apply when an induced voltage which is caused by the ring flux is measured, for example using ring-flux measurement probes, instead of measuring the shaft voltage. If the ring flux is measured directly instead of this, correspondingly analogous statements can be made. The ring flux is proportional to the first derivative with respect to time of the stator flux, as is directly evident from equations (1) and (4). The amplitude of the transfer function for the change component of the ring flux therefore does not rise as a square function (as in the case of the shaft voltage) but linearly with the order n of the harmonics. There is still a linear dependency for the phases.

EXAMPLE

Figure 4:
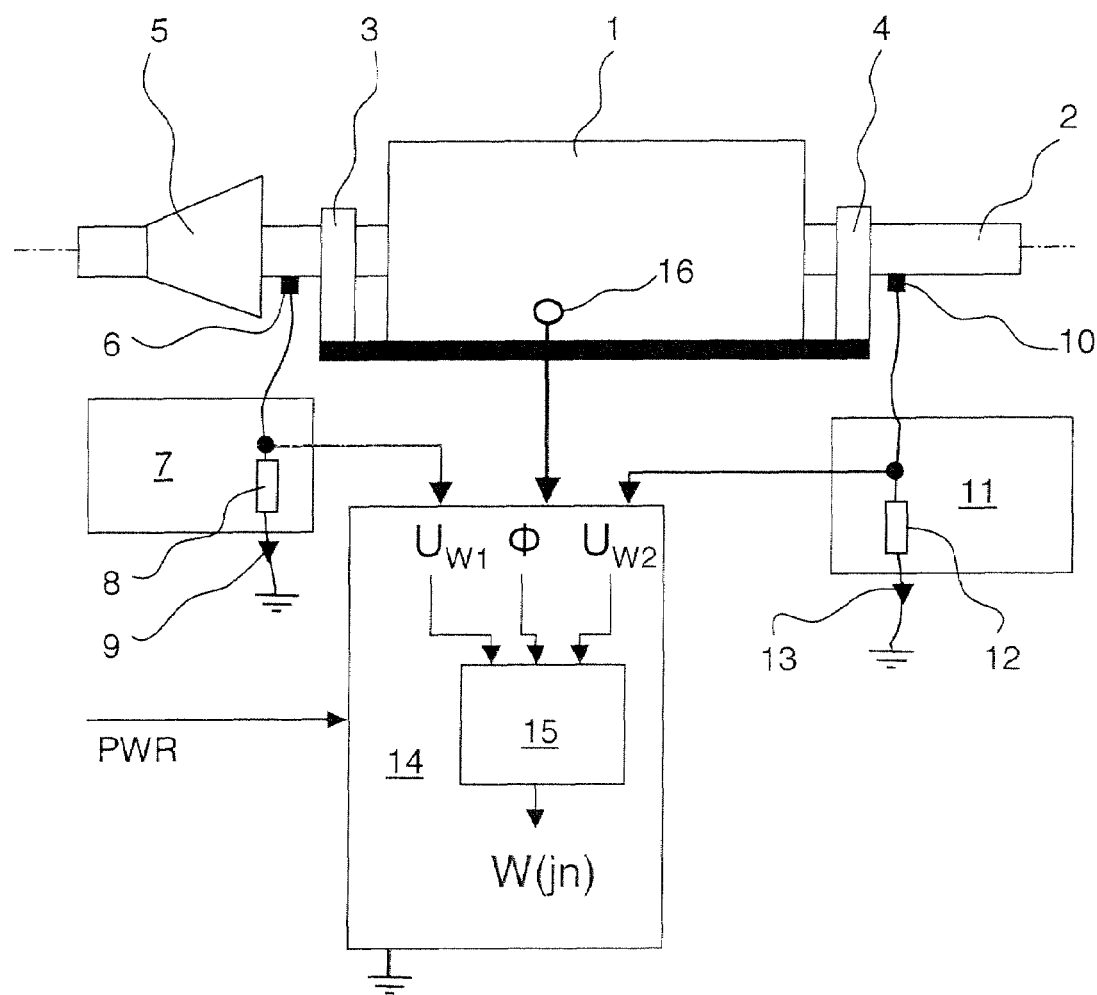
FIG. 4 shows an exemplary embodiment of a device according to the invention.

This concept will now be explained in more detail with reference to one specific example. FIG. 4 shows a preferred measurement arrangement. A generator 1 has a shaft 2 which is borne in bearings 3, 4 and is driven by a turbine 5. The shaft 2 is grounded via two grounding brushes 6, 10 and two grounding modules 7, 11. In this case, two different shaft voltages $U_{W1}$, $U_{W2}$ are dropped across the grounding resistances 8, 12. The DE grounding module 7 (DE=drive end) has a low impedance and the RC module 11 (RC=resistor/capacitor) has a high impedance, as a result of which the shaft voltage $U_{W2}$ tapped of by the grounding current 13 from the RC module will be higher than the shaft voltage $U_{W1}$ tapped off by the grounding current 9 from the DE module. The two shaft voltages are supplied to the evaluation unit 14. Furthermore, a measurement coil 16 is arranged on the stator of the generator 1 and its output voltage is likewise supplied to the evaluation unit 14. This coil is arranged in the air gap of the generator and measures the main flux $\Phi$. In addition, various data PWR relating to the load states of the generator, for example the active power MW and the reactive power MVAr is supplied to the evaluation unit 14.

The input voltages of the evaluation unit are digitized by means of ADCs. The evaluation unit 14 now continuously measures the shaft voltage and the main flux signal, and calculates the phase and amplitude spectra in these variables by means of suitable filtering and FFT (Fast Fourier Transform). A transformation module 15 is provided for this purpose in the evaluation unit 14, and may be in the form of hardware or software. The evaluation unit continuously calculates the discrete transfer functions $W(jn)$ from the spectra and its values for integer multiples of the rotation frequency, and continuously compares these transfer functions with reference values $W_{Ref}(jn)$ which were recorded in the same or similar load states. By way of example, these reference values were recorded during commissioning of the generator in various load states or even over the entire load range, and were stored in the evaluation unit.

A change component $T(jn)$ is obtained by subtraction of the reference values or reference spectra.

This change component is recorded, and the theoretical model is periodically (at short time intervals, for example one a minute) fitted to the change component, for example by means of a non-linear fit of the equation (8) to the amplitudes and phases of the change components, with the constants C and α in this case being used as fit parameters. The constants C and α as well as statistical parameters relating to the fit are obtained from the fit, and are stored. These variables are compared with predetermined conditions. If one of these conditions is satisfied, the presence of an interlaminar short circuit is deduced, and an alarm signal is emitted. One suitable condition for example, is that a statistical test, for example a Chi-squared test supports, with a certain significance, the hypothesis that the measured change components satisfy the theoretical model. The size and the location of the interlaminar short circuit can now be deduced from the determined values of C and α. Furthermore, the recorded data can be used to obtain information about the development of the interlaminar short circuit.

In summary, the method and the device according to the present invention can have the characteristic
that, in order to define an interlaminar short circuit, a characteristic pattern of the change of the shaft voltage of the machine with respect to a reference shaft voltage is searched for, with this change pattern being obtained from reference values of the magnetic stator flux;
that these reference values of the stator flux are spectral characteristic values of the stator flux;
that the measured values of stray-flux coils which are arranged in the air gap of the machine or measurement loops which are inserted directly into the laminated stator core are used to obtain the spectral characteristic values of the stator flux;
or that these spectral characteristic values are derived from measurements of the terminal voltage;
or that these spectral characteristic values are derived by calculation from machine parameters and load parameters;
that instantaneously measured reference values of the stator flux are used;
that historical reference values of the stator flux are used;
that transfer functions of the shaft voltage are calculated, which describe the relationship between the spectrum of the stator flux and the spectrum of the associated shaft voltage, and that the change pattern is searched for as a change pattern in the transfer functions, for which purpose the instantaneous transfer function is compared with a historical transfer function;
that, instead of the shaft voltage, a voltage is used for analysis, which voltage is measured by means of ring-flux sensors and is proportional to the ring flux in the stator;
that the device used contains a device for measurement of the shaft voltage and a device for measurement of the stator flux; and/or
that the device used contains ring-flux sensors for measurement of the ring flux in the stator.

The invention is, of course, not restricted to the above exemplary embodiment, but allows numerous variants.

LIST OF REFERENCE SIGNS

1 Generator
2 Shaft
3 First bearing
4 Second bearing
5 Turbine
6 First grounding brush
7 DE module
8 Grounding resistance
9 Grounding current
10 Second grounding brush
11 RC module
12 Grounding resistance
13 Grounding current
14 Evaluation unit
15 Transformation unit
16 Measurement coil
21 Stator
22 Rotor
$U_W$ Shaft voltage
$\Delta U_W$ Change in the shaft voltage
$U_{W1}$ First shaft voltage
$U_{W2}$ Second shaft voltage
$\Phi$ Stator flux
$\Phi 1, \Phi 2$ Main flux
$\Phi_S$ Ring flux component
PWR Performance data, power data
W(jn) Transfer function
E1 First plane
E2 Second plane
B Magnetic field
KS Short circuit
FS Field probe
α Angle
$i_K$ Short-circuit current

What is claimed is:

1. A method for determining a short circuit between at least two stator laminates in an electrical machine having a rotor mounted on a shaft and a stator, the method comprising:
rotating the rotor on the shaft relative to the stator so as to pass a magnetic stator flux, varying over time, through the stator;
determining, during the rotation, a measurement variable sensitive to a short-circuit current caused by the magnetic stator flux between the at least two stator laminates;
determining the magnetic stator flux;
providing a theoretical model describing a relationship between the magnetic stator flux and the measurement value or an auxiliary variable derived from the measurement value; and
comparing the measurement variable or the auxiliary variable with the theoretical model.

2. The method as recited in claim 1, wherein the determining of the magnetic stator flux is performed by at least one of a measurement and a calculation.

3. The method as recited in claim 1, wherein the comparing is performed to determine a measure for at least one of a probability of a presence of the short circuit; a magnitude of the short circuit; and a spatial position of the short circuit in the stator.

4. The method as recited in claim 1, wherein the rotating of the rotor is performed at a rotation frequency and further comprising determining spectral components of the measurement variable or of the auxiliary variable at multiples of the rotation frequency, and comparing the spectral components with the theoretical model.

5. The method as recited in claim 4, further comprising determining a transfer function between a spectral component of the magnetic stator flux and a spectral component of the measurement variable or of the auxiliary variable for the same multiple of the rotation frequency for a plurality of multiples of the rotation frequency, and comparing the transfer function with a theoretical model of the transfer function.

6. The method as recited in claim 1, wherein the measurement variable is a shaft voltage.

7. The method as recited in claim 6, wherein the auxiliary variable is determined as a change in the shaft voltage relative to a reference value and further comprising calculating a transfer function between a spectral component of the magnetic stator flux and a spectral component of the auxiliary variable for the same multiple of a rotation frequency for a plurality of multiples of the rotation frequency, and determining an extent to which at least one of the following characteristics, derived from a theoretical model, is satisfied:

an amplitude of the transfer function depends on a square of the multiple of the rotation frequency;

a phase of the transfer function depends linearly on the multiple of the rotation frequency.

8. The method as recited in claim 1, wherein the measurement variable is a ring flux along a closed path around the shaft.

9. The method as claimed in claim 8, wherein the auxiliary variable is determined as a change in the ring flux relative to a reference value and further comprising calculating a transfer function between a spectral component of the magnetic stator flux and a spectral component of the auxiliary variable for the same multiple of the rotation frequency for a plurality of multiples of the rotation frequency, and determining an extent to which at least one of the following characteristics, as theoretical model, is satisfied:

an amplitude of the transfer function is linearly dependent on the multiple of the rotation frequency;

a phase of the transfer function depends linearly on the multiple of the rotation frequency.

10. The method as recited in claim 1, wherein the auxiliary variable is a change in the measurement variable with respect to a reference value.

11. The method as recited in claim 10, further comprising determining reference values of the measurement variable at a reference time for selected reference load states of the electrical machine and storing the reference values in a memory, and wherein the determining of the auxiliary value is performed using at least one reference value of the measurement variable in a reference load state similar to an instantaneous load state.

12. The method as recited in claim 1, wherein the determining of the magnetic stator flux is determined during the rotating.

13. The method as recited claim 12, further comprising determining reference values of the magnetic stator flux at a reference time for selected reference load states of the electrical machine and storing the reference values in a memory, and wherein the comparing with the theoretical model is performed using at least one reference value of the magnetic stator flux in a reference load state similar to an instantaneous load state.

14. The method as recited in claim 1, wherein the determining of the magnetic stator flux is performed using at least one magnetic measurement probe disposed in one of the stator and an air gap between the stator and the rotor.

15. The method as recited in claim 1, wherein the determining of the magnetic stator flux is performed using a calculation from at least one of a terminal voltage, a machine parameter and a load parameter of the electrical machine.

16. A device for determining a short circuit between at least two stator laminates in an electrical machine having a rotor rotating on a shaft and a stator, a magnetic stator flux varying over time passing through the stator, the device comprising:

a measurement arrangement configured to determine a measurement variable sensitive to a short-circuit current caused by the magnetic stator flux between at least two stator laminates;

a unit configured to determine the magnetic stator flux;

an evaluation unit configured to compare the measurement variable or an auxiliary variable derived therefrom with a theoretical model for the relationship between the measurement variable or the auxiliary variable and the magnetic stator flux.

17. The device as recited in claim 16, wherein the evaluation unit includes a transformation module configured to determine spectral components of the measurement variable or of the auxiliary variable, and wherein the evaluation unit is configured to compare selected spectral components with the theoretical model.

18. The device as recited in claim 16, wherein the measurement variable is a shaft voltage and the measurement arrangement includes at least two brushes configured to determine the shaft voltage between two different axial points on the shaft.

19. The device as recited in claim 16, wherein the measurement variable is a ring flux along a closed path around the shaft, and wherein the measurement arrangement includes at least one magnetic measurement probe for determining the ring flux.

20. The device as recited in claim 16, wherein the unit includes at least one magnetic measurement probe.

* * * * *